United States Patent
Song et al.

(10) Patent No.: US 12,226,044 B2
(45) Date of Patent: Feb. 18, 2025

(54) EXTERIOR MATERIAL FOR COOKING APPLIANCE AND MANUFACTURING METHOD THEREOF

(71) Applicant: SAMSUNG ELECTRONICS CO., LTD., Suwon-si (KR)

(72) Inventors: Jiyoung Song, Suwon-si (KR);
Hyunseok Shin, Suwon-si (KR);
Youngdeog Koh, Suwon-si (KR);
Kwangjoo Kim, Suwon-si (KR);
Taegyeong Kim, Suwon-si (KR);
Nohcheol Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 122 days.

(21) Appl. No.: 17/860,615

(22) Filed: Jul. 8, 2022

(65) Prior Publication Data
US 2023/0070297 A1    Mar. 9, 2023

Related U.S. Application Data

(63) Continuation of application No. PCT/KR2022/008136, filed on Jun. 9, 2022.

(30) Foreign Application Priority Data

Aug. 27, 2021 (KR) .......... 10-2021-0114004
Nov. 1, 2021 (KR) .......... 10-2021-0148309

(51) Int. Cl.
*A47J 36/04* (2006.01)
*C23C 14/02* (2006.01)
(Continued)

(52) U.S. Cl.
CPC .......... *A47J 36/04* (2013.01); *C23C 14/024* (2013.01); *C23C 14/0605* (2013.01); *C23C 14/24* (2013.01); *C23C 14/5873* (2013.01)

(58) Field of Classification Search
CPC .......... C23C 14/0605; C23C 14/5873; C23C 14/024
See application file for complete search history.

(56) References Cited

U.S. PATENT DOCUMENTS 6,942,920 B2    9/2005    Carre et al.
8,109,248 B2    2/2012    Lyo et al.
(Continued)

FOREIGN PATENT DOCUMENTS

JP    08033573 A   *  2/1996
JP    WO2007/135901    11/2007
(Continued)

OTHER PUBLICATIONS

Oliveira, Influence of the Silicon Interlayer on Diamond-Like Carbon Films Deposited on Glass Substrates, Jun. 2012, Revista Univap, Sao Jose dos Campos-SP, vol. 18, No. 31, pp. 112-121. (Year: 2012).*

(Continued)

*Primary Examiner* — Monique R Jackson
(74) *Attorney, Agent, or Firm* — STAAS & HALSEY LLP

(57) ABSTRACT

An exterior material for cooking appliance capable of improving visibility, Vickers hardness, and scratch resistance by forming laser holes in a surface of an exterior material including a Diamond like carbon (DLC) coating layer, and a method for manufacturing the exterior material. The cooking appliance exterior material includes a base material, a Diamond like carbon (DLC) coating layer provided on the base material, an adhesive layer provided between the base material and the DLC coating layer to attach the DLS coating layer to the base material to incase an adhesion force between the base material and the DLC (Continued)

coating layer, and a plurality of laser holes provided in a surface of the exterior material.

20 Claims, 6 Drawing Sheets

(51) Int. Cl.
*C23C 14/06* (2006.01)
*C23C 14/24* (2006.01)
*C23C 14/58* (2006.01)

(56) References Cited

U.S. PATENT DOCUMENTS

| | | | |
|---|---|---|---|
| 9,018,113 B2 | 4/2015 | Siebers et al. | |
| 10,056,697 B2 | 8/2018 | Kagawa | |
| 11,300,352 B2 | 4/2022 | Kim et al. | |
| 11,516,930 B2 | 11/2022 | Kim et al. | |
| 2002/0028289 A1* | 3/2002 | Veerasamy | B08B 17/065 427/249.7 |
| 2003/0215642 A1* | 11/2003 | Carre | C03C 17/3441 428/428 |
| 2006/0226517 A1* | 10/2006 | Iwanaga | H10K 50/844 257/639 |
| 2015/0118394 A1* | 4/2015 | Varadarajan | C23C 16/36 427/249.15 |
| 2016/0314964 A1* | 10/2016 | Tang | H01L 21/02274 |
| 2017/0187856 A1 | 6/2017 | Kim et al. | |
| 2018/0274848 A1* | 9/2018 | Kim | F25D 23/028 |
| 2019/0292410 A1* | 9/2019 | Fitzpatrick | C25D 7/123 |
| 2020/0224303 A1* | 7/2020 | Shin | C25D 11/38 |

FOREIGN PATENT DOCUMENTS

| | | |
|---|---|---|
| JP | 2015-26528 | 2/2015 |
| JP | 6169093 | 7/2017 |
| JP | 2017-188506 | 10/2017 |
| KR | 10-0887851 | 3/2009 |
| KR | 10-2013-0142404 | 12/2013 |
| KR | 10-1485885 B1 | 1/2015 |
| KR | 10-2016-0028174 | 3/2016 |
| KR | 10-1694538 | 1/2017 |
| KR | 10-2017-0019117 | 2/2017 |
| KR | 10-2017-0031950 | 3/2017 |
| KR | 10-2017-0040710 | 4/2017 |
| KR | 10-2018-0036762 | 4/2018 |
| KR | 10-2018-0121253 A | 11/2018 |

OTHER PUBLICATIONS

Eryilmaz, Deposition, characterization, and tribological applications of near-frictionless carbon films on glass and ceramic substrates, 2006, Journal of Physics: Condensed Matter, Institute of Physics Publishing, vol. 18, pp. S1751-S1762. (Year: 2006).*
Delfani-Abbariki, Enhancing the adhesion of diamond-like carbon films to steel substrates using silicon-containing interlayers, 2018, Surface & Coatings Technology 350, pp. 74-83. (Year: 2018).*
Machine translation of JPH0833573A, published 1996, Powered by EPO and Google. (Year: 1996).*
Machine translation of KR20170031950A, published 2017, Powered by EPO and Google. (Year: 2017).*
Pauleau, Residual Stresses in DLC Films and Adhesion to Various Substrates (2008) in "Tribology of Diamond-Like Carbon Films: Fundamentals and Applications", Donnet and Erdemir (eds.), pp. 102-136. (Year: 2008).*
International Search Report dated Sep. 29, 2022 in International Patent Application No. PCT/KR2022/008136 (3 pages; 4 pages English translation).
PCT/ISA/237 dated Sep. 29, 2022 in International Patent Application No. PCT/KR2022/008136 (3 pages; 4 pages).
Office Action dated Dec. 17, 2024 issued in Korean Application No. 10-2021-0148309.

* cited by examiner

TRANSMITTANCE DETERIORATION

TRANSMITTANCE IMPROVEMENT

EXTERIOR MATERIAL FOR COOKING APPLIANCE AND MANUFACTURING METHOD THEREOF

CROSS-REFERENCE TO RELATED APPLICATION

This application is a continuation application, filed under 35 U.S.C. § 111(a), of International Application PCT/KR2022/008136 filed Jun. 9, 2022, and is based on and claims priority under 35 U.S.C. § 119 to Korean Patent Applications No. 10-2021-0114004, filed on Aug. 27, 2021, and No. 10-2021-0148309, filed on Nov. 1, 2021 in the Korean Intellectual Property Office, the disclosures of which are incorporated by reference herein in their entireties.

BACKGROUND

1. Field

The disclosure relates to an exterior material for a cooking appliance and a manufacturing method thereof, and more particularly, to an exterior material for a cooking appliance with improved visibility by forming laser holes in the surface, and a method for manufacturing the exterior material for the cooking appliance.

2. Description of the Related Art

Cooking machines and cooking tools are collectively called cooking appliances, and the cooking appliances are equipment for cooking, reheating, or cooling food, etc. through a heat source, such as a gas, electricity, a steam, etc. Representative cooking appliances include an induction, an oven, a gas range, a microwave, etc.

The exterior material of such a cooking appliance requires a certain level of durability for protecting the cooking appliance from external impacts. However, in the case in which an exterior material including a coating layer is used for the improvement of durability, a problem that visibility deteriorates is generated.

Meanwhile, recently, cooking appliances include flat panel displays, such as a Liquid Crystal Display (LCD), a Light Emitting Diode (LED), etc., for easy control and luxurious outer appearances. The cooking appliances including flat panel displays have limits in using exterior materials with low visibility.

Accordingly, an exterior material for a cooking appliance meeting a certain level of durability while improving visibility urgently needs to be introduced.

SUMMARY

To overcome the above-described problem, it is an object to the disclosure to provide an exterior material for a cooking appliance capable of improving visibility, Vickers hardness, and scratch resistance by forming laser holes in a surface of an exterior material including a Diamond like carbon (DLC) coating layer, and a method for manufacturing the exterior material.

Additional aspects of the disclosure will be set forth in part in the description which follows and, in part, will be obvious from the description, or may be learned by practice of the disclosure.

An exterior material for a cooking appliance according to an embodiment of the disclosure includes: a base material; a Diamond like carbon (DLC) coating layer provided on the base material; an adhesive layer provided between the base material and the DLC coating layer to attach the DLS coating layer to the base material to increase to increase an adhesion force between the base material and the DLC coating layer; and a plurality of laser holes provided in a surface of the cooking appliance exterior material The exterior material according to an embodiment of the disclosure, the base material may include ceramic glass.

The exterior material according to an embodiment of the disclosure, a thickness of the base material may be about 3 mm to 6 mm.

The exterior material according to an embodiment of the disclosure, Vickers hardness of the DLC coating layer may be about 800 Hv to 1500 Hv.

The exterior material according to an embodiment of the disclosure, a vertical force by which a scratch is generated on the DLC coating layer may be about 15N to 20N.

The exterior material according to an embodiment of the disclosure, a thickness of the DLC coating layer may be about 1 μM to 3 μM.

The exterior material according to an embodiment of the disclosure, the adhesive layer may include at least one of Si, $SiO_x$, or $R_3SiO_x$.

The exterior material according to an embodiment of the disclosure, the adhesive layer may include Trimethoxysilane (TMS).

The exterior material according to an embodiment of the disclosure, a thickness of the adhesive layer may be about 0.1 μM to 1.0 μM.

The exterior material according to an embodiment of the disclosure, a radius of the laser hole may be about 0.01 μM to 0.9 μM.

The exterior material according to an embodiment of the disclosure, a depth of each laser hole may be about 1.5 μM to 4.0 μM.

The exterior material according to an embodiment of the disclosure, the plurality of laser holes may be arranged at intervals of about 0.01 μM to 0.9 μM.

The exterior material according to an embodiment of the disclosure, transmittance of the exterior material may be about 1% to 10%.

The exterior material according to an embodiment of the disclosure, the exterior material may be provided on a flat panel display to protect the flat panel display and to display information displayed on the flat panel display therethrough, and the plurality of laser holes increases visibility of information display on the flat panel display through the exterior material.

A method for manufacturing an exterior material for a cooking appliance, according to an embodiment of the disclosure, includes: preparing a base material; etching a surface of the base material; forming an adhesive layer on the etched base material; forming a Diamond like carbon (DLC) coating layer on the adhesive layer; and forming a plurality of laser holes in a surface of the cooking appliance exterior material.

The method for manufacturing the exterior material, according to an embodiment of the disclosure, the etching of the surface of the base material may be performed through Linear Ion Source (LIS) treatment.

The method for manufacturing the exterior material, according to an embodiment of the disclosure, at least one of the forming of the adhesive layer or the forming of the DLC coating layer may be performed by a Physical Vapor Deposition (PVD) method. The method for manufacturing the exterior material, according to an embodiment of the disclosure, the PVD method may include a Linear Ion Source (LIS) method.

A cooking appliance according to an embodiment of the disclosure includes: a cooking appliance body; and an exterior material provided on an outer side of the cooking appliance body, wherein the exterior material includes: a base material; a Diamond like carbon (DLC) coating layer provided on the base material; an adhesive layer provided between the base material and the DLC coating layer to attach the DLS coating layer to the base material to increase an adhesion force between the base material and the DLC coating layer; and a plurality of laser holes provided in a surface of the exterior material.

The cooking appliance according to an embodiment of the disclosure, transmittance of the exterior material may be about 1% to 10%.

The cooking appliance The exterior material is provided on a flat panel display to protect the flat panel display and to display information displayed on the flat panel display therethrough, and the plurality of laser holes increases visibility of information display on the flat panel display through the exterior material.

The PVD method includes a Linear Ion Source (LIS) method.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
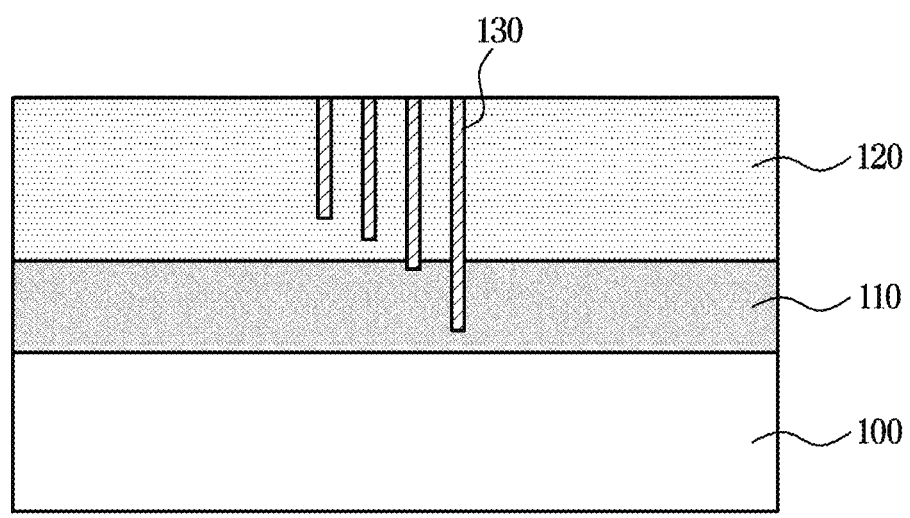
FIG. 1 is a schematic diagram of an exterior material for a cooking appliance according to an embodiment of the disclosure.

Hereinafter, the embodiments of the disclosure will be described in detail with reference to the accompanying drawings. The following embodiments are provided to sufficiently transfer the concepts of the disclosure to one of ordinary skill in the technical art to which the disclosure belongs. However, the disclosure is not limited to these embodiments, and may be embodied in another form. In the drawings, portions that are irrelevant to the descriptions may be not shown in order to clarify the disclosure, and also, for easy understanding, the sizes of components are more or less exaggeratedly shown.

In the entire specification, it will be understood that when a certain portion "includes" a certain component, the portion does not exclude another component but can further include another component, unless the context clearly dictates otherwise.

It is to be understood that the singular forms "a," "an," and "the" include plural referents unless the context clearly dictates otherwise. An exterior material 10 for a cooking appliance according to an embodiment of the disclosure may include: a base material 100; a Diamond like carbon (DLC) coating layer 120 provided on the base material 100; an adhesive layer 110 provided between the base material 100 and the DLC coating layer 120 and improving an adhesion force between the base material 100 and the DLC coating layer 120; and a plurality of laser holes 130 provided in a surface of the cooking appliance exterior material.

FIG. 1 is a schematic diagram of an exterior material 10 for a cooking appliance according to an embodiment of the disclosure.

Referring to FIG. 1, the base material 100 may be provided in a lowest layer of the cooking appliance exterior material, and the DLC coating layer 120 may be formed on the base material 100. Accordingly, the DLC coating layer 120 may form an outermost surface of the cooking appliance exterior material. Also, the adhesive layer 110 for improving an adhesion force between the base material 100 and the DLC coating layer 120 may be formed between the base material 100 and the DLC coating layer 120. Also, the plurality of laser holes 130 may be formed in the surface of the cooking appliance exterior material.

The base material 100 may include tempered glass such as ceramic glass not to be easily damaged. However, the base material 100 may be made of any other material.

Also, the base material 100 may have a thickness of 3 mm to 6 mm. A small thickness of the base material 100 may result in low durability, whereas a great thickness of the base material 100 may result in an increase of a raw material. Accordingly, the thickness of the base material 100 may be 3 mm to 6 mm, preferably, 4 mm to 6 mm, although not limited thereto.

The exterior material 10 according to an embodiment of the disclosure may improve durability by forming the DLC coating layer 120. Vickers hardness of the DLC coating layer 120 may be 800 Hv to 1500 Hv.

Also, the exterior material 10 according to an embodiment of the disclosure may improve scratch resistance by forming the DLC coating layer 120.

Scratch resistance may be estimated through a variable load scratch test. The variable load scratch test may be performed based on an ASTM D7027, C1326, C1327 or C1624 scratch test standard.

By performing the variable load scratch test on the exterior material 10 according to an embodiment of the disclosure, a vertical force by which a scratch is generated on the DLC coating layer 120 was measured as 15 N to 20 N. The vertical force by which the scratch is generated is a vertical force measured at time at which the scratch is visible to the naked eye. The time at which the scratch is visible to the naked eye was estimated based on time at which a difference between brightness of an area where the scratch is generated and brightness of a background of the exterior material 10 is 3% or more.

Also, the DLC coating layer 120 may have a thickness of 1 μm to 3 μm. A small thickness of the DLC coating layer 120 may result in low Vickers hardness and low thermal resistance. Accordingly, the thickness of the DLC coating layer 120 may be 1 μm or more. However, a too great thickness of the DLC coating layer 120 may result in low visibility and high manufacturing cost. Accordingly, the thickness of the DLC coating layer 120 may be 3 μm or less. Preferably, the thickness of the DLC coating layer 120 may be 1.5 μm to 2.5 μm, although not limited thereto.

The adhesive layer 110 for improving an adhesion force between the base material 100 and the DLC coating may include at least one of Si, $SiO_x$, and $R_3SiO_x$. Also, the adhesion layer may include Trimethoxysilane (TMS).

The adhesive layer 110 may be formed to improve an adhesion force between the base material 100 and the DLC coating layer 120. The adhesive layer 110 may include at least one or more of Si, $SiO_x$, and $R_3SiO_x$, and may include Trimethoxysilane (TMS). Si represents silicon, $SiO_x$ represents silicon oxides collectively called, and $R_3SiO_x$ represents silicon oxides including side chains. Because the adhesive layer 110 includes Si, the adhesive layer 110 may prevent detachment between the base material 100 and the DLC coating layer 120, and increase an adhesion force between the base material 100 and the DLC coating layer 120.

Also, the adhesive layer 110 may have a thickness of 0.1 μm to 1 μm. A small thickness of the adhesive layer 110 may result in a low adhesion force between the base material 100 and the DLC coating layer 120. Accordingly, the thickness of the adhesive layer 110 may be 0.1 μm or more. However, a too great thickness of the adhesive layer 110 may result in low visibility and high manufacturing cost. Accordingly, the thickness of the adhesive layer 110 may be 1 μm or less. Preferably, the thickness of the adhesive layer 110 may be 0.2 μm to 0.6 μm, although not limited thereto.

The exterior material 10 according to an embodiment of the disclosure may include a plurality of laser holes 130 provided in the surface.

The plurality of laser holes 130 provided in the surface of the exterior material 10 may be a key configuration capable of improving the visibility of the cooking appliance exterior material. The plurality of laser holes 130 may be provided through a Fiber Laser Dimple forming apparatus. By adjusting a width of a laser to be sprayed from the Fiber Laser Dimple forming apparatus, radiuses of the laser holes 130 may be controlled. Also, by adjusting power of the Fiber Laser Dimple forming apparatus, depths of the laser holes 130 may be controlled. Also, by adjusting moving speed of a laser spraying device in the Fiber Laser Dimple forming apparatus, intervals between the plurality of laser holes 130 may be controlled.

Each of the laser holes 130 may have a radius of 0.01 μm to 0.9 μm, preferably, 0.01 μm to 0.3 μm. Also, the laser hole 130 may have a depth of 1.5 μm to 4.0 μm. Also, intervals between the plurality of laser holes 130 may be 0.01 μm to 0.9 μm, preferably, 0.05 μm to 0.3 μm.

In a case in which the radius and depth of each laser hole 130 and the intervals of the plurality of laser holes 130 are too small, an effect of visibility improvement that may be obtained by forming the laser holes 130 may deteriorate. However, in a case in which the radius and depth of each laser hole 130 and the intervals of the plurality of laser holes 130 are too great, Vickers hardness and scratch resistance may deteriorate, and cleaning may become difficult.

Meanwhile, the plurality of laser holes 130 may be formed in the DLC coating layer 120 or in both the DLC coating layer 120 and the adhesive layer 110.

Also, in the case in which the intervals of the plurality of laser holes 130 are great, the plurality of laser holes 130 may be in a shape of circles, and in the case in which the intervals of the plurality of laser holes 130 are small, the plurality of laser holes 130 may be in a shape of quadrangles. However, the shapes of the plurality of laser holes 130 are not limited.

Figure 5:
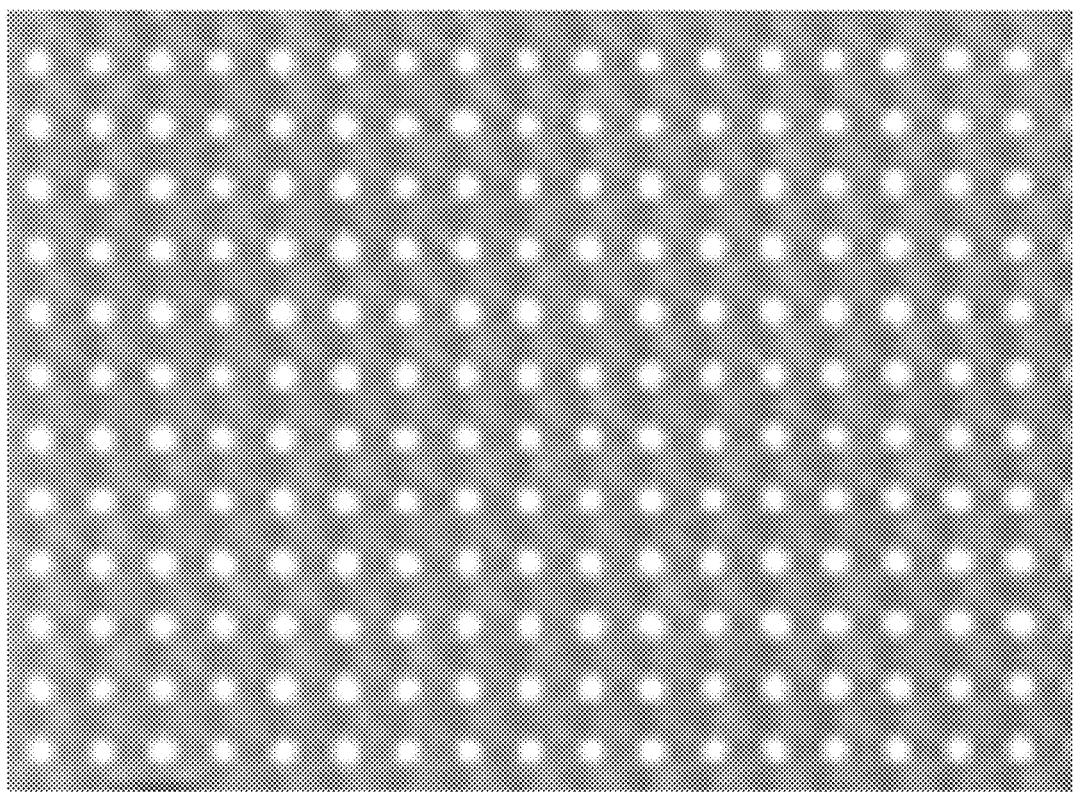
FIG. 5 is a picture obtained by photographing a surface of an exterior material for a cooking appliance according to an embodiment of the disclosure through a digital microscope.
Figure 6:
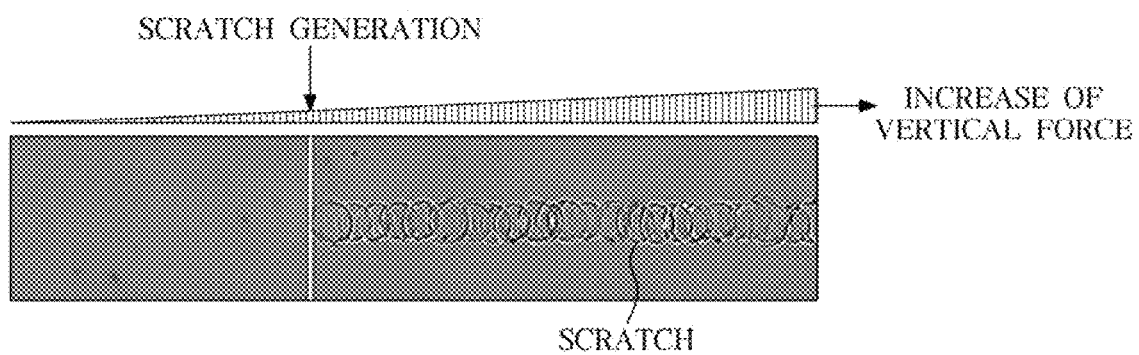
FIG. 6 is a picture showing a scratch generation behavior of an embodiment according to a variable load scratch test.

FIG. 5 is a picture obtained by photographing a surface of an exterior material for a cooking appliance according to an embodiment of the disclosure through a digital microscope.

Referring to FIG. 5, laser holes 130 formed in the surface of the exterior material 10 according to an embodiment of the disclosure are shown.

By providing the plurality of laser holes 130 in the surface of the cooking appliance exterior material, the exterior material 10 according to an embodiment of the disclosure may have transmittance of 1% to 10%.

Figure 3:
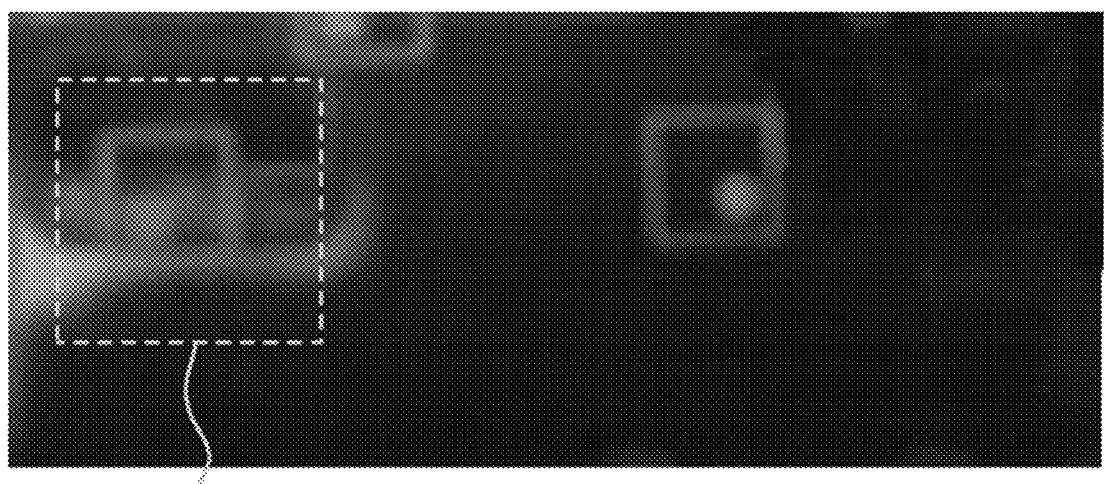
FIG. 3 is a picture for checking transmittance of a comparative example.
Figure 4:
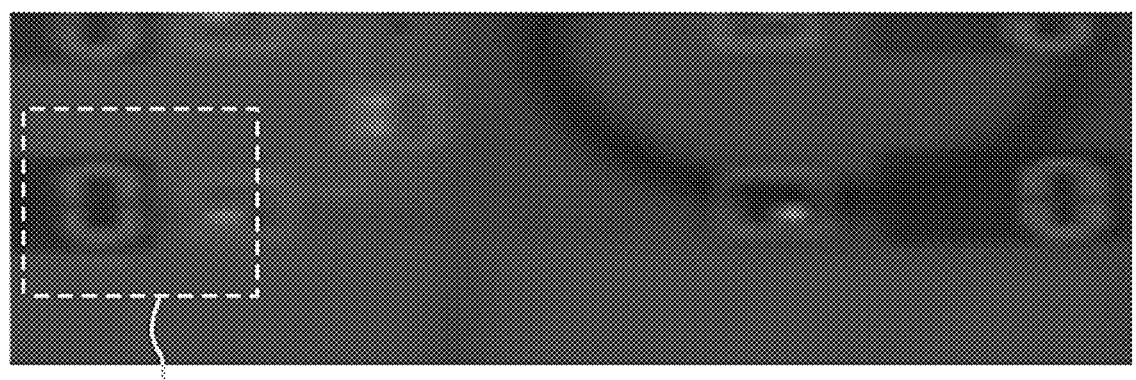
FIG. 4 is a picture for checking transmittance of an exterior material for a cooking appliance according to an embodiment of the disclosure.

FIG. 3 is a picture for checking transmittance of a comparative example. FIG. 4 is a picture for checking transmittance of an exterior material for a cooking appliance according to an embodiment of the disclosure. Referring to FIGS. 3 and 4, in the comparative example, 7-segment of a flat panel display is nearly not shown due to low transmittance, whereas, in the exterior material 10 according to an embodiment of the disclosure, 7-segment of a flat panel display is clearly shown due to improved transmittance. That is, by forming the plurality of laser holes 130 in the surface of the cooking appliance exterior material, visibility may be improved, and accordingly, the flat panel display installed inside the exterior material 10 is more clearly shown.

Meanwhile, the exterior material 10 according to an embodiment of the disclosure may enable a flat panel display installed in the cooking appliance to be visible. The flat panel display may be a LCD or LED.

Thereafter, a method for manufacturing the cooking appliance exterior material, according to another aspect of the disclosure, will be described.

The method for manufacturing the cooking appliance exterior material, according to an embodiment of the disclosure, may include: preparing a base material 100; etching a surface of the base material 100; forming an adhesive layer 110 on the etched base material 100; forming a DLC coating layer 120 on the adhesive layer 110; and forming a plurality of laser holes 130 in a surface of the cooking appliance exterior material.

Figure 2:
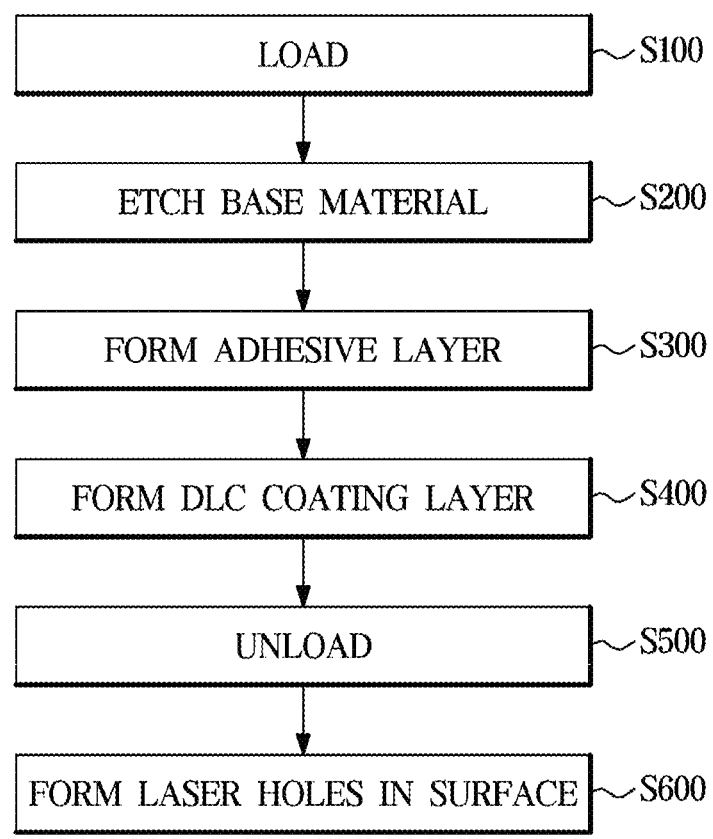
FIG. 2 is a schematic flowchart showing a method for manufacturing an exterior material for a cooking appliance, according to an embodiment of the disclosure.

FIG. 2 is a schematic flowchart showing a method for manufacturing an exterior material for a cooking appliance, according to an embodiment of the disclosure.

Referring to FIG. 2, the exterior material 10 according to an embodiment of the disclosure may be manufactured by a series of operations of loading a base material 100 on a substrate (S100), etching the base material 100 (S200), forming an adhesive layer 110 (S300), then forming a DLC coating layer 120 (S400), unloading the resultant structure (S500), and then forming a plurality of laser holes 130 in a surface of the exterior material 10 for the cooking appliance (S600).

In operation S100, the base material 100 may be loaded on the substrate.

In operation S200, a surface of the base material 100 may be etched. The etching may be performed to arrange the surface of the base material 100 and activate the base material 100 before forming a coating layer 120. The etching may be performed through Linear Ion Source (LIS) treatment which will be described below. That is, the etching may be performed by spraying an ion gun onto the surface of the base material 100.

A linear ion source (LIS) process of spraying an ion beam onto the base material 100, which is a kind of a Physical Vapor Deposition (PVD) method, may be performed. The LIS process may be performed for about 120 minutes or less. The LIS process may be performed by injecting argon (Ar) of 10 to 50 standard cubic centimeters per minute (sccm) ($cm^3$/min) into a chamber and applying a voltage of 1800±500 V to a substrate. Through the LIS process, an adhesion force of the DLC coating layer 120 with respect to the base material 100 may be improved. Also, at least one of the adhesive layer 110 and the DLC coating layer 120 may be formed by the LIS process.

More specifically, a voltage of 1800±500 V may be applied to the ion gun, and then the ion gun may be sprayed onto the substrate. The PVD method may have an advantage of high mass productivity, and a high-quality product may be manufactured through the LIS process.

In operation S300, operation of forming the adhesive layer 110 on the base material 100 may be performed. The adhesive layer 110 may include at least one of Si, $SiO_x$, and $R_3SiO_x$, and may include Trimethoxysilane (TMS). Operation of forming the adhesive layer 110 may be performed for about 200 minutes or less.

The adhesive layer 110 may be formed to improve an adhesion force between the base material 100 and the DLC coating layer 120. The adhesive layer 110 may be formed through vacuum deposition of heating and evaporating TMS and then depositing metal with a steam as a thin film. That is, the adhesive layer 110 may be formed on the base material 100 on which etching has been performed, by using an evaporator.

In operation S400, the DLC coating layer 120 may be formed on the adhesive layer 110. The DLC coating layer 120 according to an embodiment of the disclosure may be formed by ion deposition. The ion deposition may be a method for ionizing a hydrocarbon gas by plasma discharge, and then acceleration-colliding the ions with a substrate to form a thin film. More specifically, by spaying an ion gun onto the base material 100, the DCL coating layer 120 may be coated on the adhesive layer 110. The hydrocarbon gas may include acetylene ($C_2H_2$), methane ($CH_4$), and benzene ($C_6H_6$), although not limited thereto. Operation of forming the DLC coating layer 120 may be performed for 500 minutes or less.

In operation S600, the plurality of laser holes 130 may be formed in the surface of the cooking appliance exterior material. The plurality of laser holes 130 may be provided through a Fiber Laser Dimple forming apparatus. A laser may be sprayed from a laser spray device in the Fiber Laser Dimple forming apparatus, and the laser spray device may move at constant speed to form the laser holes 130 in the surface of the cooking appliance exterior material. As described above, by adjusting a width of the sprayed laser, power of the Fiber Laser Dimple forming apparatus, and a transfer speed of the laser spray device, a radius and depth of each laser hole 130 and intervals of the plurality of laser holes 130 may be controlled.

Then, a cooking appliance according to another aspect of the disclosure will be described.

A cooking appliance according to an embodiment of the disclosure may include: a cooking appliance body; and an exterior material provided on an outer side of the cooking appliance body, wherein the exterior material may include a base material 100; a DLC coating layer 120 provided on the base material 100; an adhesive layer 110 provided between the base material 100 and the DLC coating layer 120 and improving an adhesion force between the base material 100 and the DLC coating layer 120; and a plurality of laser holes 130 provided in a surface of the exterior material.

The exterior material of the cooking appliance has been described above.

Various components constructing the cooking appliance may be installed in the cooking appliance body. Also, the cooking appliance body may provide a user interface for receiving a control command from a user and displaying operation information of the cooking appliance for the user. The user interface may include a flat panel display, and use a LCD or LED.

By providing the plurality of laser holes 130 in the surface of the exterior material of the cooking appliance, the exterior material of the cooking appliance according to an embodiment of the disclosure may have transmittance of about 1% to 10%. Accordingly, by using the exterior material 10 with improved visibility, a user may more clearly recognize an operation state of the cooking appliance.

Hereinafter, the disclosure will be described in more detail through an embodiment. However, the embodiment is provided for illustration purpose only and not for the purpose of limiting the disclosure. The scope of right of the disclosure is decided by content written in the claims and content reasonably inferred from the claims.

After exterior material 10 test pieces of about 600*520 mm, having laser holes 130 shown in Table 1 are prepared, a transmittance test, a Vickers hardness test, a variable load scratch test, and a blue scrubber scratch test were performed.

TABLE 1

| Classification | Laser Hole (μm) | | |
| --- | --- | --- | --- |
| | Radius | Depth | Interval |
| Embodiment 1 | 0.05 | 3.0 | 0.3 |
| Embodiment 2 | 0.08 | 3.0 | 0.1 |
| Embodiment 3 | 0.1 | 3.0 | 0.12 |
| Embodiment 4 | 0.2 | 3.0 | 0.2 |
| Embodiment 5 | 0.3 | 3.0 | 0.2 |
| Comparative example 1 | 0.005 | 3.0 | 0.2 |
| Comparative example 2 | 1.0 | 3.0 | 0.2 |
| Comparative example 3 | 0.3 | 1.4 | 0.2 |
| Comparative example 4 | 0.3 | 4.5 | 0.2 |
| Comparative example 5 | 0.3 | 3.0 | 0.005 |
| Comparative example 6 | 0.3 | 3.0 | 1.0 |

Results of the transmittance test, the Vickers hardness test, the variable load scratch test, and the blue scrubber scratch test are shown in Table 2, below.

The transmittance was measured by irradiating light of a visible ray area onto a surface of the cooking appliance exterior material. The transmittance was measured by a method of measuring a ratio of transmitted incident flux with respect to flux of main light being incident to the exterior material 10 through a spectrophotometer.

The Vickers hardness was measured by pressing the test pieces with pyramid combined particles having a diamond quadrangular pyramid and measuring diagonal lines of pyramid-shaped concave portions made in the test pieces to thereby obtain hardness.

The variable load scratch test was performed by a method of applying a vertical force to the test pieces through a diamond indenter (Rockwell C cone) and observing scratch generation behaviors generated on surfaces of the test pieces. At this time, by increasing the vertical force applied to the test pieces gradually from 0.5 N to 20 N while moving the test pieces at speed of 240 mm/s, the scratch generation behaviors were observed through an optical microscope or an electron microscope.

A vertical force by which a scratch is generated is a vertical force measured at time at which the scratch is visible to the naked eye. The time at which the scratch is visible to the naked eye was based on time at which a difference between brightness of an area where the scratch is generated and brightness of a background of the exterior material 10 is 3%.

The blue scrubber scratch test was performed by a method of measuring a scratch distribution generated by causing friction 100 times with a constant force of 3 kgf. The blue scrubber scratch test was performed by applying a relatively greater force than in the variable load scratch test, and it is meaningful that the blue scrubber scratch test was performed under a condition that is more similar to an environment of a cooking appliance in actual use than that of the variable load scratch test. Meanwhile, Table 2 shows generation distributions of scratches having grooves of 1 μm.

TABLE 2

| Classification | Transmittance (%) | Vickers Hardness (Hv) | Variable Load Scratch Test (N) | Blue Scrubber Scratch Test (Pieces/20 mm²) |
|---|---|---|---|---|
| Embodiment 1 | 1 | 950 | 18 | 10 |
| Embodiment 2 | 3 | 980 | 15 | 13 |
| Embodiment 3 | 2 | 1050 | 18 | 12 |
| Embodiment 4 | 3 | 1005 | 20 | 13 |
| Embodiment 5 | 5 | 980 | 18 | 15 |
| Comparative Example 1 | 0.3 | 950 | 20 | 13 |
| Comparative Example 2 | 1 | 720 | 12 | 50 |
| Comparative Example 3 | 0.5 | 970 | 18 | 15 |
| Comparative Example 4 | 2 | 680 | 10 | 67 |
| Comparative Example 5 | 0.5 | 990 | 18 | 17 |
| Comparative Example 6 | 1.5 | 700 | 12 | 55 |

Referring to Table 2, because embodiments 1 to 5 satisfy all of radiuses, depths, and intervals of laser holes 130, proposed in the disclosure, the embodiments 1 to 5 satisfied transmittance of 1% to 10%, Vickers hardness of 800 Hv to 1500 Hv, and a vertical force of 15 N to 20 N by which a scratch is generated. That is, it may be estimated that both visibility and durability are excellent.

However, comparative examples 1, 3, and 5 showed low transmittance because of short radiuses, depths, and intervals of laser holes 130.

Also, comparative examples 2, 4, and 6 showed low Vickers hardness and poor scratch test results because of long radiuses, depths, and intervals of laser holes 130. That is, it may be estimated that durability is low.

According to an embodiment of the disclosure, there may be provided an exterior material 10 for a cooking appliance capable of improving visibility, Vickers hardness, and scratch resistance by forming laser holes 130 in a surface of an exterior material including a DLC coating layer 120, and a method for manufacturing the cooking appliance exterior material.

However, effects that can be achieved by the exterior material 10 according to an embodiment of the disclosure are not limited to the above-mentioned those, and other effects not mentioned may be clearly understood by one of ordinary skill in the technical art to which the disclosure belongs from the above descriptions.

Although a few embodiments of the disclosure have been shown and described, it would be appreciated by those skilled in the art that changes may be made in these embodiments without departing from the principles and spirit of the disclosure, the scope of which is defined in the claims and their equivalents.

What is claimed is:

1. An exterior material for a cooking appliance, comprising:
   a base material;
   a Diamond like carbon (DLC) coating layer provided on the base material;
   an adhesive layer provided between the base material and the DLC coating layer to improve an adhesion force between the base material and the DLC coating layer; and
   a plurality of laser holes provided in a surface of the cooking appliance exterior material, the plurality of laser holes having different depths,
   wherein the plurality of laser holes includes at least one laser hole formed in the DLC coating layer, and at least one other laser hole formed in the DLC coating layer and the adhesive layer by penetrating the DLC coating layer and into the adhesive layer.

2. The exterior material of claim 1, wherein the base material comprises ceramic glass.

3. The exterior material of claim 1, wherein a thickness of the base material is about 3 mm to 6 mm.

4. The exterior material of claim 1, wherein Vickers hardness of the DLC coating layer is about 800 HV to 1500 Hv.

5. The exterior material of claim 1, wherein a vertical force by which a scratch is generated on the DLC coating layer is about 15N to 20N.

6. The exterior material of claim 1, wherein a thickness of the DLC coating layer is about 1 μm to 3 μm.

7. The exterior material of claim 1, wherein the adhesive layer comprises at least one of Si, SiOx, and R3SiOx.

8. The exterior material of claim 1, wherein the adhesive layer comprises Trimethoxysilane (TMS).

9. The exterior material of claim 1, wherein a thickness of the adhesive layer is about 0.1 μm to 1.0 μm.

10. The exterior material of claim 1, wherein a radius of the plurality of laser holes is about 0.01 μm to 0.9 μm.

11. The exterior material of claim 1, wherein a depth of each of the plurality of laser holes is about 1.5 μm to 4.0 μm.

12. The exterior material of claim 1, wherein the plurality of laser holes is arranged at intervals of about 0.01 μm to 0.9 μm.

13. The exterior material of claim 1, wherein transmittance of the cooking appliance exterior material is about 1% to 10%.

14. The exterior material of claim 1, wherein the exterior material is provided on a flat panel display to protect the flat panel display and to display information displayed on the flat panel display therethrough, and the plurality of laser holes increases visibility of information display on the flat panel display through the exterior material.

15. A method for manufacturing an exterior material for a cooking appliance, comprising:
   preparing a base material;
   etching a surface of the base material;
   forming an adhesive layer on the etched base material;
   forming a Diamond like carbon (DLC) coating layer on the adhesive layer; and
   forming a plurality of laser holes in a surface of the cooking appliance exterior material,
   wherein the forming of the plurality of laser holes comprises:
      forming the plurality of laser holes with different depths;
      forming at least one laser hole of the plurality of laser holes in the DLC coating layer; and forming at least one other laser hole in the DLC coating layer and the adhesive layer by penetrating the DLC coating layer and into the adhesive layer.

16. The method according to claim 15, wherein the etching of a surface of the base material comprises performing Linear Ion Source (LIS) treatment to etch the surface of the base material.

17. The method according to claim 15, wherein the forming of an adhesive layer includes forming the adhesive layer on the etched base material using a Physical Vapor Deposition (PVD) method and the forming of a DLC coating layer includes forming the DLC coating layer on the adhesive layer using the PVD method.

18. The method according to claim 17, wherein the PVD method includes a Linear Ion Source (LIS) method.

19. A cooking appliance, comprising:
a cooking appliance body; and
an exterior material provided on an outer side of the cooking appliance body,
wherein the exterior material includes:
a base material;
a Diamond like carbon (DLC) coating layer provided on the base material;
an adhesive layer provided between the base material and the DLC coating layer to attach the DLC coating layer to the base material to increase an adhesion force between the base material and the DLC coating layer; and
a plurality of laser holes formed in a surface of the exterior material, the plurality of laser holes having different depths,
wherein the plurality of laser holes includes at least one laser hole formed in the DLC coating layer, and at least one other laser hole formed in the DLC coating layer and the adhesive layer by penetrating the DLC coating layer and into the adhesive layer.

20. The cooking appliance according to claim 19, wherein transmittance of the exterior material is about 1% to 10%.

* * * * *